United States Patent
Hongo et al.

(10) Patent No.: US 10,249,549 B2
(45) Date of Patent: Apr. 2, 2019

(54) CERAMIC CIRCUIT BOARD, ELECTRONIC CIRCUIT MODULE, AND METHOD FOR MANUFACTURING ELECTRONIC CIRCUIT MODULE

(71) Applicant: Murata Manufacturing Co., Ltd., Nagaokakyo-shi, Kyoto-fu (JP)

(72) Inventors: Hiromitsu Hongo, Nagaokakyo (JP); Takahiro Sumi, Nagaokakyo (JP); Masaaki Hanao, Nagaokakyo (JP); Kazuo Kishida, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 25 days.

(21) Appl. No.: 15/214,718

(22) Filed: Jul. 20, 2016

(65) Prior Publication Data

US 2017/0034917 A1 Feb. 2, 2017

(30) Foreign Application Priority Data

Jul. 31, 2015 (JP) .................................. 2015-151590

(51) Int. Cl.
*H05K 1/18* (2006.01)
*H01L 23/15* (2006.01)
(Continued)

(52) U.S. Cl.
CPC ........... *H01L 23/15* (2013.01); *H05K 1/0218* (2013.01); *H05K 1/0306* (2013.01);
(Continued)

(58) Field of Classification Search
CPC ....... H01L 2224/16225; H01L 2224/97; H01L 23/15; H05K 1/0218; H05K 1/0306;
(Continued)

(56) References Cited

U.S. PATENT DOCUMENTS 4,695,858 A * 9/1987 Takezawa ............... H01L 31/12
250/239
7,336,501 B2 * 2/2008 Tanaka .............. H01L 23/49822
257/E23.062

(Continued)

FOREIGN PATENT DOCUMENTS

| JP | 2003347102 A | | 12/2003 |
|---|---|---|---|
| JP | 2006332255 A | | 12/2006 |
| JP | 2010027363 | * | 2/2010 |
| JP | 2010027363 A | | 2/2010 |

*Primary Examiner* — Yuriy Semenenko
(74) *Attorney, Agent, or Firm* — Arent Fox LLP

(57) ABSTRACT

A ceramic circuit board that includes a ceramic insulator layer, grounding pattern conductors, connection lands disposed on a first surface of the ceramic circuit board, and grounding electrodes disposed on a second surface of the ceramic circuit board and connected to the grounding pattern conductors. Each of the grounding pattern conductors contains a metal and an oxide and includes a pattern main portion disposed inside the ceramic circuit board and an extended portion in which a first end thereof is connected to the pattern main portion and a second end thereof is exposed at a side surface of the ceramic circuit board. The metal content of the extended portion is lower than the metal content of the pattern main portion.

6 Claims, 14 Drawing Sheets

(51) Int. Cl.
*H05K 1/02* (2006.01)
*H05K 1/03* (2006.01)
*H05K 3/40* (2006.01)
*H05K 3/46* (2006.01)
*H05K 1/11* (2006.01)
*H05K 3/28* (2006.01)

(52) U.S. Cl.
CPC ......... *H05K 3/4061* (2013.01); *H05K 3/4629* (2013.01); *H01L 2224/16225* (2013.01); *H01L 2224/97* (2013.01); *H05K 1/115* (2013.01); *H05K 3/284* (2013.01); *H05K 2201/0715* (2013.01)

(58) Field of Classification Search
CPC ........... H05K 1/115; H05K 2201/0715; H05K 3/284; H05K 3/4061; H05K 3/4629
See application file for complete search history.

(56) References Cited

U.S. PATENT DOCUMENTS

| | | | |
|---|---|---|---|
| 7,808,799 B2* | 10/2010 | Kawabe | H01L 23/49822 174/250 |
| 7,932,471 B2* | 4/2011 | Yamamoto | H01G 4/232 174/260 |
| 2006/0266547 A1* | 11/2006 | Koga | H01L 21/561 174/255 |
| 2007/0076392 A1* | 4/2007 | Urashima | H01G 2/06 361/763 |
| 2016/0073490 A1* | 3/2016 | Branchevsky | H01L 23/06 361/783 |
| 2016/0095224 A1* | 3/2016 | Chen | H05K 3/4697 361/746 |

* cited by examiner

PATTERN MAIN PORTION (METAL CONTENT: HIGH)

EXTENDED PORTION (METAL CONTENT: LOW)

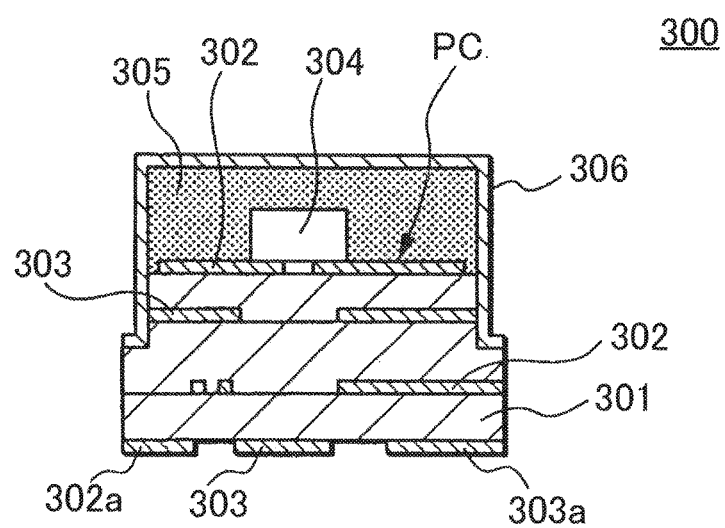
FIG.14 - PRIOR ART

CERAMIC CIRCUIT BOARD, ELECTRONIC CIRCUIT MODULE, AND METHOD FOR MANUFACTURING ELECTRONIC CIRCUIT MODULE

CROSS REFERENCE TO RELATED APPLICATION

The present application claims priority to Japanese Patent Application No. 2015-151590, filed Jul. 31, 2015, the entire contents of which is incorporated herein by reference.

BACKGROUND OF THE INVENTION

Field of the Invention

The present invention relates to a ceramic circuit board, an electronic circuit module, and a method for manufacturing an electronic circuit module. In particular, the present invention relates to a ceramic circuit board, in which grounding pattern conductors are exposed at the side surfaces, an electronic circuit module including the same, and a method for manufacturing the electronic circuit module.

Description of the Related Art

A ceramic circuit board includes a ceramic insulator layer, via conductors and pattern conductors disposed orthogonally and parallel, respectively, to the principal surface of the ceramic circuit board, and electrodes disposed on both the principal surfaces of the ceramic circuit board. The pattern conductors include a grounding pattern conductor, which is connected to an electrically conductive film and a grounding electrode and which serves as a passage for passing electromagnetic wave noise to the grounding electrode, when an electronic component is connected to the ceramic circuit board and is embedded in an embedding layer provided with the electrically conductive film on the surface so as to produce an electronic circuit module. Japanese Unexamined Patent Application Publication No. 2006-332255 proposes an example of an electronic circuit module including such a ceramic circuit board.

FIG. 14 is a sectional view of an electronic circuit module 300 described in Japanese Unexamined Patent Application Publication No. 2006-332255. A ceramic circuit board 301 used in the electronic circuit module 300 includes a ceramic insulator layer and pattern conductors PC including signal pattern conductors 302 and grounding pattern conductors 303. The signal pattern conductors 302 are disposed on the upper surface of the ceramic circuit board 301 and between stacked layers and have a plurality of terminal portions 302a disposed on the lower surface of the ceramic circuit board 301. The terminal portions 302a are connected by via conductors, although not illustrated in the drawing, to the signal pattern conductors 302 disposed on the upper surface of the ceramic circuit board 301 and between stacked layers.

The grounding pattern conductors 303 are disposed between stacked layers and on the lower surface of the ceramic circuit board 301 and have a terminal portion 303a disposed on the lower surface of the ceramic circuit board 301. The terminal portion 303a is connected by a via conductor or the like, although not illustrated in the drawing, to the grounding pattern conductor 303 disposed between the stacked layers. In addition, the grounding pattern conductor 303 located between the stacked layers is exposed at side surfaces, which are opposite to each other, of the ceramic circuit board 301.

An electronic component 304 is mounted on the upper surface of the ceramic circuit board 301 so as to form a predetermined electronic circuit. An embedding layer 305 is disposed on the upper surface of the ceramic circuit board 301 in the state of entirely covering the electronic component 304 and embedding the electronic component 304. The embedding layer 305 is disposed such that the side surface becomes flush with the side surface of the ceramic circuit board 301. An electrically conductive film 306 is disposed on the outer surface of the embedding layer 305 and the side surfaces including at least locations, at which the grounding pattern conductors 303 are exposed, of the ceramic circuit board 301.

The electronic circuit module 300 having the above-described configuration is considered to have advantages that an effect of shielding by the electrically conductive film 306 against electromagnetic noise is high and connection between the grounding pattern conductor 303 and the electrically conductive film 306 is good.

The electronic circuit module 300 having the above-described configuration is produced while the ceramic circuit boards 301 are in the state of a collective board. That is, the electronic components 304 are mounted on the collective board, the embedding layer 305 in the collective state is formed, slit portions for exposing the grounding pattern conductors 303 are formed, the electrically conductive film 306 in the collective state is formed and, thereafter, the collective board is cut so as to obtain the electronic circuit modules 300. In general, the slit portions are formed by cutting the embedding layer 305 in the collective state with a dicing saw and making slits, which expose the grounding pattern conductors 303 and which do not reach the lower surface, in the collective board under the embedding layer 305.

According to the above-described method, chips of the embedding layer 305 in the collective state may cover the exposed portions of the grounding pattern conductors 303 and, thereby, connection between the electrically conductive film 306 and the grounding pattern conductors 303 may become insufficient.

In order to avoid the above-described problem, it is considered that the above-described formation of the slits into the collective board is performed so as not to expose the grounding pattern conductors 303 and, thereafter, the collective board is cut with a dicing saw by using a blade thinner than a blade used for forming the slits. In this case, the electrically conductive film 306 is formed after the collective board is cut. It is also considered that a method described in, for example, Japanese Unexamined Patent Application Publication No. 2012-84746 is applied, scribe lines are made in the collective board by a laser or a diamond knife and, thereafter, the collective board is cut by applying stress to the portion provided with the scribe lines so as to cause breakage.

SUMMARY OF THE INVENTION

The present inventors performed the investigation described below so as to make the present invention.

The present inventors found that when the collective board was cut with the dicing saw, the grounding pattern conductor 303 was torn in some cases by a blade of the dicing saw. In that case, the end portion of the grounding pattern conductor 303 may not be sufficiently exposed at the side surface of the ceramic circuit board 301 and may be insufficiently connected to the electrically conductive film 306.

The present inventors also found that even in the method in which the scribe lines were made in the collective board and, thereafter, the collective board was cut into ceramic circuit boards, there were variations in the breakage positions of the grounding pattern conductors 303. That is, it was found that some end portions of the grounding pattern conductors 303 protruded from the side surface of the ceramic circuit board 301 to a great extent and some end portions were not exposed at the side surface sufficiently. In this case as well, connection to the electrically conductive film 306 may become insufficient.

The above-described phenomenon is estimated to be derived from the fact that the grounding pattern conductor 303 is, for example, a sintered material of Cu powder and is sintered sufficiently so as to be assumed as a metal plate. That is, it is considered that the grounding pattern conductor 303 has high ductility and, in the cutting with the dicing saw, the grounding pattern conductor 303 is somewhat extended by movement of the blade and is torn, and the breakage position is located inside the side surface of the ceramic circuit board 301.

In the case where scribe lines are made in the collective board and then the collective board is cut into ceramic circuit boards as well, the ceramic insulator layer is cut along the scribe lines. It is considered that the grounding pattern conductor 303 is somewhat extended by application of the stress and is torn, and the breakage position is located inside the side surface of the ceramic circuit board 301. Therefore, some end portions of the grounding pattern conductors 303 protrude from the side surface of the ceramic circuit board 301 to a great extent and some other end portions are not exposed at the side surface sufficiently.

Accordingly, it is an object of the present invention to provide a ceramic circuit board, in which the end portion of each of the grounding pattern conductors is located at a position sufficiently close to the side surface of the ceramic circuit board and is able to be reliably connected to an electrically conductive film for shielding, an electronic circuit module including the same, and a method for manufacturing the electronic circuit module.

The present inventors performed intensive research. As a result, the inventors found that the above-described problems were able to be solved by reducing incidentally the ductility of the grounding pattern conductor in the vicinity of the side surface of the ceramic circuit board, and the present invention was made. That is, in the present invention, an improvement in the state of the grounding pattern conductor exposed at the side surface of the ceramic circuit board is intended and, as a result, an improvement in connection between an electrically conductive film and the grounding pattern conductor is intended.

The present invention relates to a ceramic circuit board.

According to preferred embodiments of the present invention, a ceramic circuit board includes a ceramic insulator layer, grounding pattern conductors, connection lands disposed on one principal surface of the ceramic circuit board, and grounding electrodes disposed on the other principal surface of the ceramic circuit board and connected to the grounding pattern conductors. Each of the grounding pattern conductors contains a metal and an oxide of at least one metal element contained in the ceramic insulator layer. In addition, the grounding pattern conductors include a pattern main portion disposed inside the ceramic circuit board and an extended portion, in which one end portion is connected to the pattern main portion and the other end portion is exposed at the side surface of the ceramic circuit board. The metal content of the extended portion is lower than the metal content of the pattern main portion.

In the above ceramic circuit board, the ductility of the extended portion is reduced because the metal content of the extended portion is low. Therefore, the above-described issues do not occur, and the other end portion formed by cutting the extended portion in the collective state when the ceramic circuit board is produced is located at a position sufficiently close to the side surface of the ceramic circuit board. As a result, when an electronic circuit module is produced, the other end portion of the extended portion is reliably connected to an electrically conductive film for shielding, and an effect of shielding against electromagnetic noise can be enhanced sufficiently. In this regard, the side surface of the ceramic circuit board refers to a surface that connects one principal surface to the other principal surface and may be a curved surface or have a height difference.

The grounding pattern conductor contains an oxide of at least one metal element contained in the ceramic insulator layer. Accordingly, the bonding to the ceramic insulator layer is high and delamination between the grounding pattern conductor and the ceramic insulator layer can be suppressed effectively.

According to preferred embodiments, it is preferable that the ceramic circuit board have the features described below. That is, the metal content of the extended portion is about 30 percent by volume or more and 60 percent by volume or less, and the metal content of the pattern main portion is about 80 percent by volume or more.

In the ceramic circuit board, the ductility of the extended portion is reliably reduced, and the other end portion of the extended portion is reliably located at a position sufficiently close to the side surface of the ceramic circuit board. As a result, when the electronic circuit module is produced, the other end portion of the extended portion is more reliably connected to the electrically conductive film for shielding, and an effect of shielding against electromagnetic noise can be reliably enhanced.

In the ceramic circuit board according to preferred embodiments of the present invention, the pattern main portion and the extended portion may be disposed in the same plane or in different planes so as to be connected to each other by a via conductor. In any of the cases above, the above-described effects can be exerted.

According to preferred embodiments of the present invention, it is preferable that the ceramic circuit board have the features described below. That is, the absolute value of the distance from the side surface of the ceramic circuit board to the other end portion of the extended portion is about 10 μm or less.

In the ceramic circuit board, the absolute value of the distance between the other end portion of the extended portion and the side surface of the ceramic circuit board is about 10 μm or less and the positions thereof are reliably close to each other. As a result, the above-described effects can be reliably exerted.

Also, the present invention relates to an electronic circuit module.

According to preferred embodiments of the present invention, an electronic circuit module includes a ceramic circuit board, an electronic component, an embedding layer, and an electrically conductive film. The ceramic circuit board is the ceramic circuit board according to preferred embodiments of the present invention. The electronic component is connected to the connection lands disposed on one principal surface of the ceramic circuit board. The embedding layer is disposed on the one principal surface of the ceramic circuit board so as to embed the electronic component. The electrically conductive film is disposed on a region including the outer surface of the embedding layer and at least part of the side surface of the ceramic circuit board and is connected to the other end portion of the extended portion of each of the grounding pattern conductors.

The electronic circuit module includes the ceramic circuit board according to preferred embodiments of the present invention. Therefore, the other end portion of the extended portion is located at a position sufficiently close to the side surface of the ceramic circuit board and is reliably connected to the electrically conductive film for shielding. As a result, an effect of shielding against electromagnetic noise is enhanced sufficiently.

Also, the present invention relates to a method for manufacturing an electronic circuit module.

According to preferred embodiments of the present invention, a method for manufacturing an electronic circuit module is a method for manufacturing an electronic circuit module including a ceramic circuit board, an electronic component, an embedding layer, and an electrically conductive film. The method includes the following first to eleventh steps.

The first step is a step for producing green sheets containing a raw material powder of the ceramic insulator layer included in the ceramic circuit board.

The second step is a step for forming grounding pattern conductors before firing in the collective state on at least one of the green sheets. Each of the grounding pattern conductors before firing in the collective state contains a metal and an oxide of at least one metal element contained in the ceramic insulator layer. The pattern conductors include a pattern main portion before firing and an extended portion before firing, in which one end portion is connected to the pattern main portion before firing and the metal content is lower than the metal content of the pattern main portion before firing.

The third step is a step for forming via conductors before firing in at least one of the green sheets, the via conductors penetrating the green sheet.

The fourth step is a step for producing a multilayer body by stacking the green sheets including the green sheet provided with the grounding pattern conductors before firing in the collective state and the green sheet provided with the via conductors before firing. The multilayer body includes the ceramic insulator layer before firing, the grounding pattern conductors before firing in the collective state, and the via conductors before firing.

The fifth step is a step for producing a ceramic circuit board before firing in the collective state by forming connection lands before firing on one principal surface of the multilayer body and forming grounding electrodes before firing on the other principal surface of the multilayer body.

The sixth step is a step for producing a ceramic circuit board in the collective state by firing the ceramic circuit board before firing in the collective state. The ceramic circuit board in the collective state includes the ceramic insulator layer, the grounding pattern conductors in the collective state, each of the grounding pattern conductors including the pattern main portion and the extended portion, in which one end portion is connected to the pattern main portion, the connection lands disposed on the one principal surface, and the grounding electrodes disposed on the other principal surface and connected to the grounding pattern conductors.

The seventh step is a step for connecting the electronic components to the connection lands disposed on the one principal surface of the ceramic circuit board.

The eighth step is a step for forming an embedding layer in the collective state on the one principal surface of the ceramic circuit board so as to embed the electronic components.

The ninth step is a step for cutting the embedding layer in the collective state and forming slits, which have a depth not exposing the grounding pattern conductors in the collective state, into the one principal surface of the ceramic circuit board in the collective state.

The tenth step is a step for cutting the ceramic circuit board, in the collective state, provided with the slits so as to expose the other end portion of the extended portion of each of the grounding pattern conductors and producing pieces including the ceramic circuit board, the electronic component, and the embedding layer.

The eleventh step is a step for forming an electrically conductive film on a region including the outer surface of the embedding layer and at least part of the side surface of the ceramic circuit board of the piece so as to be connected to the other end portion of the extended portion of each of the grounding pattern conductors.

The method for manufacturing an electronic circuit module includes the first step to the eleventh step. That is, the ductility of the extended portion is able to be reduced because the metal content of the extended portion is reduced intentionally. Therefore, the above-described issues do not occur, and the other end portion formed by cutting the extended portion in the collective state is located at a position sufficiently close to the side surface of the ceramic circuit board. Thus, the other end portion of the extended portion is reliably connected to an electrically conductive film for shielding. As a result, the electronic circuit module having sufficiently high effect of shielding against electromagnetic noise is obtained reliably and easily.

According to preferred embodiments of the present invention, it is preferable that the method for manufacturing an electronic circuit module have the features described below. That is, the formation of the pattern main portion before firing in the second step is performed by using a first electrode paste configured to have a ratio of about 0/100 or more and 20/80 or less, where the denominator is the volume of a Cu powder and the numerator is the volume of the oxide powder of at least one metal element contained in the ceramic insulator layer.

The formation of the extended portion before firing is performed by using a second electrode paste composed of a copper powder coated with $Al_2O_3$ so as to have a ratio of about 4/96 or more and 6/94 or less, where the denominator is the weight of Cu and the numerator is the weight of $Al_2O_3$. Alternatively, the formation is performed by using a third electrode paste configured to have a ratio of about 10/90 or more and 20/80 or less, where the denominator is the volume of a Cu powder coated with $Al_2O_3$ such that a ratio of the weight of $Al_2O_3$ to the weight of Cu is about 1/99 or more and 3/97 or less and the numerator is the volume of the oxide powder of at least one metal element contained in the ceramic insulator layer.

The method for manufacturing an electronic circuit module is able to reliably reduce the ductility of the extended portion. Therefore, the other end portion formed by cutting the extended portion in the collective state is located at a position sufficiently close to the side surface of the ceramic circuit board and thus the extended portion is further reliably connected to the electrically conductive film for shielding. As a result, the electronic circuit module having sufficiently high effect of shielding against electromagnetic noise is obtained further reliably and easily.

According to preferred embodiments of the present invention, it is also preferable that the method for manufacturing an electronic circuit module have the features described below. That is, the formation of the pattern main portion before firing in the second step is performed by using the first electrode paste. The formation of the extended portion before firing is performed by using a fourth electrode paste containing a CuAl alloy powder configured to have a ratio of about 2/98 or more and 5/95 or less, where the denominator is the weight of Cu and the numerator is the weight of Al.

In the case where the electrically conductive powder of the electrode paste used for forming the extended portion before firing is the CuAl alloy powder, Al is oxidized easily compared with Cu and, therefore, the surface of the electrically conductive powder is made into a form of being coated with a thin $Al_2O_3$ layer. Accordingly, the sinterability of the electrically conductive powder can be reduced.

That is, the above-described method for manufacturing an electronic circuit module is also able to reliably reduce the ductility of the extended portion. Therefore, the other end portion formed by cutting the extended portion in the collective state is located at a position sufficiently close to the side surface of the ceramic circuit board and thus the other end portion of the extended portion is further reliably connected to the electrically conductive film for shielding. As a result, the electronic circuit module having sufficiently high effect of shielding against electromagnetic noise is obtained further reliably and easily.

According to preferred embodiments of the present invention, in the method for manufacturing an electronic circuit module, the tenth step may be performed by forming scribe lines at positions, which are opposite to the slits formed in the one principal surface, of the other principal surface of the ceramic circuit board in the collective state, and applying stress to the locations provided with the scribe lines so as to merge the scribe lines with the slits. Alternatively, the tenth step may be performed by forming slits having a width smaller than the width of the slits in the one principal surface of the ceramic circuit board in the collective state from the bottom portion of the slits formed in the ceramic circuit board in the collective state so as to reach the other principal surface. In any of the above cases, the above-described effects can be exerted.

Other features, elements, characteristics and advantages of the present invention will become more apparent from the following detailed description of preferred embodiments of the present invention with reference to the attached drawings.

BRIEF DESCRIPTION OF THE DRAWINGS

FIG. 14 is a schematic sectional view of an electronic circuit module in the related art.

DETAILED DESCRIPTION OF THE PREFERRED EMBODIMENTS

The features of the present invention will be described below in detail with reference to the embodiments according to the present invention.

First Embodiment of Ceramic Circuit Board

A ceramic circuit board 1 as a first embodiment of a ceramic circuit board according to embodiments of the present invention will be described with reference to FIG. 1. The ceramic circuit board 1 is used as a circuit board for connecting electronic components including active components, e.g., IC chips, and passive components, e.g., capacitors, and wiring them to each other so as to produce a module.

Structure of Ceramic Circuit Board

Figure 1:
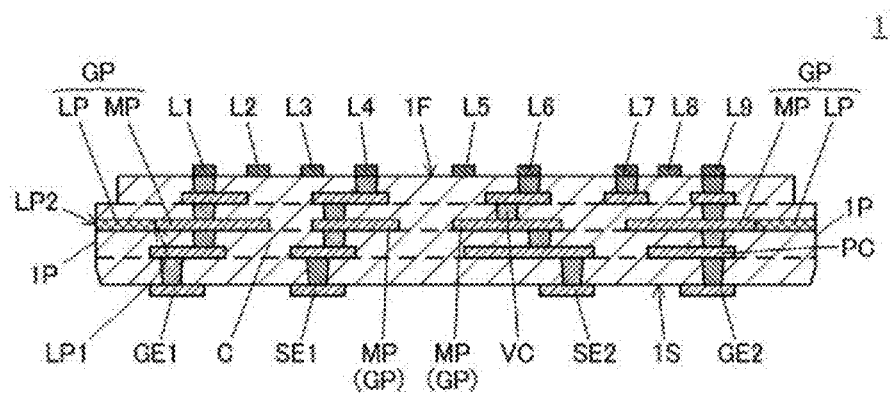
FIG. 1 is a schematic sectional view of a ceramic circuit board as a first embodiment of a ceramic circuit board according to embodiments of the present invention.

FIG. 1 is a schematic sectional view of the ceramic circuit board 1. The ceramic circuit board 1 includes a ceramic insulator layer C, inner conductors including pattern conductors PC and via conductors VC, connection lands L1 to L9 disposed on one principal surface 1F, and grounding electrodes GE1 and GE2 and signal electrodes SE1 and SE2 disposed on the other principal surface 1S.

The pattern conductors PC include grounding pattern conductors GP connected to the grounding electrodes GE1 and GE2. Each of the grounding pattern conductors GP contains a metal and an oxide of at least one metal element contained in the ceramic insulator layer C and includes a pattern main portion MP and an extended portion LP. The pattern main portion MP is disposed inside the ceramic circuit board. Regarding the extended portion LP, one end portion LP1 is connected to the pattern main portion MP in the same plane, and the other end portion LP2 is exposed at the side surface 1P of the ceramic circuit board 1. The metal content of the extended portion LP is lower than the metal content of the pattern main portion MP.

The ceramic insulator layer C contains a ceramic material, e.g., a Ba—Al—Si—Mn oxide, as described later. The inner conductors are formed by using, for example, Cu. The connection lands L1 to L9, the grounding electrodes GE1 and GE2, and the signal electrodes SE1 and SE2 are formed by using, for example, Cu. The outer surface of the Cu layer may be coated with a plating layer containing Ni, a plating layer containing Sn, and the like. For example, Cu is used as the metal for the pattern conductor PC.

In FIG. 1, broken lines are provided inside the ceramic circuit board 1. This indicates that the ceramic circuit board 1 is produced by stacking the ceramic green sheets and performing sintering, and does not indicate that there are such interfaces in the ceramic circuit board 1 in practice.

Figure 2A:
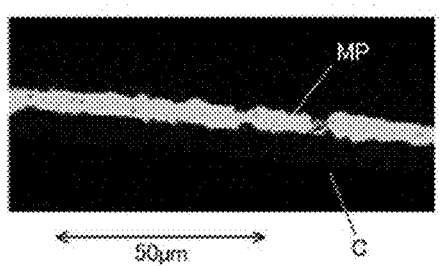
FIGS. 2A and 2B are SEM observation photographs of a pattern main portion and an extended portion, respectively, of a grounding pattern conductor in the ceramic circuit board according to embodiments of the present invention (reference numerals correspond to those of the ceramic circuit board illustrated in FIG. 1)
Figure 2B:
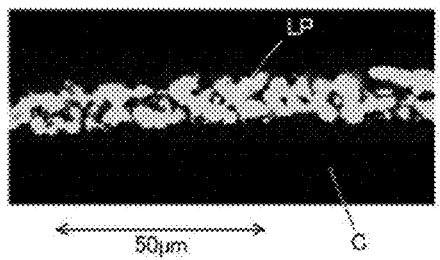

FIGS. 2A and 2B are SEM observation photographs of the pattern main portion MP and the extended portion LP, respectively, of the grounding pattern conductor GP in the ceramic circuit board 1.

The pattern main portion MP is sintered sufficiently to such an extent that the pattern main portion MP is assumed to be a single metal plate, and this portion has high ductility. On the other hand, the extended portion LP has a higher content of oxide of at least one metal element contained in the ceramic insulator layer C compared with the content in the pattern main portion MP. That is, the metal content of the extended portion LP is lower than the metal content of the pattern main portion MP. Therefore, the ductility of the extended portion LP is reduced.

As a result, the other end portion LP2 of the extended portion LP formed by cutting the grounding pattern conductor GP in the collective state when the ceramic circuit board 1 is produced is located at a position sufficiently close to the side surface 1P of the ceramic circuit board 1. Specifically, the absolute value of the distance from the side surface 1P of the ceramic circuit board 1 to the other end portion LP2 of the extended portion LP can be made to be about 10 μm or less.

In the grounding pattern conductor GP, the metal content of the extended portion LP is preferably 30 percent by volume or more and 60 percent by volume or less, and the metal content of the pattern main portion MP is preferably 80 percent by volume or more. It is preferable that the oxide contained in the grounding pattern conductor GP be the same oxide as the oxide constituting the ceramic insulator layer C and, therefore, a so-called common base material be employed. In this case, delamination between the grounding pattern conductor GP and the ceramic insulator layer C is suppressed effectively because the bondability between the grounding pattern conductor GP and the ceramic insulator layer C is good.

Second Embodiment of Ceramic Circuit Board

A ceramic circuit board 1A as a second embodiment of the ceramic circuit board according to embodiments of the present invention will be described with reference to FIG. 3. The ceramic circuit board 1A is used similarly to the ceramic circuit board 1.

Structure of Ceramic Circuit Board

Figure 3:
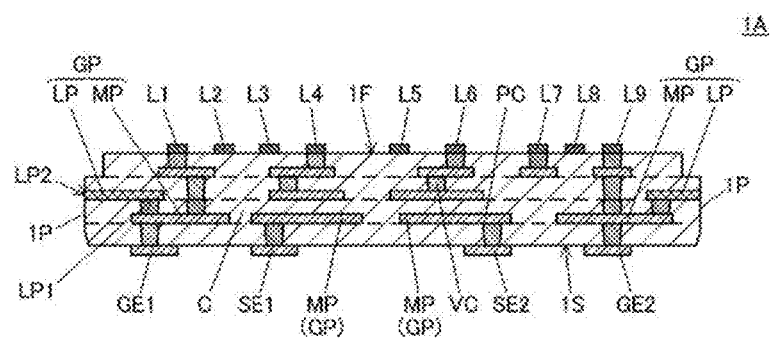
FIG. 3 is a schematic sectional view of a ceramic circuit board as a second embodiment of the ceramic circuit board according to embodiments of the present invention.

FIG. 3 is a schematic sectional view of the ceramic circuit board 1A. In the ceramic circuit board 1, the one end LP1 of the extended portion LP is connected to the pattern main portion MP in the same plane. On the other hand, the ceramic circuit board 1A is different from the ceramic circuit board 1 in that the pattern main portion MP and the extended portion LP are disposed in different planes and the pattern main portion MP is connected to the one end portion LP1 of the extended portion LP by a via conductor VC. The other constituents are the same as the constituents of the ceramic circuit board 1 and, therefore, explanations thereof will not be provided.

In the ceramic circuit board 1A as well, the ductility of the extended portion LP is reduced and, therefore, the other end portion LP2 of the extended portion LP is located at a position sufficiently close to the side surface 1P of the ceramic circuit board 1A.

First Embodiment of Electronic Circuit Module

An electronic circuit module 100 as a first embodiment of an electronic circuit module according to embodiments of the present invention will be described with reference to FIGS. 4A and 4B.

Structure of Electronic Circuit Module

Figure 4A:
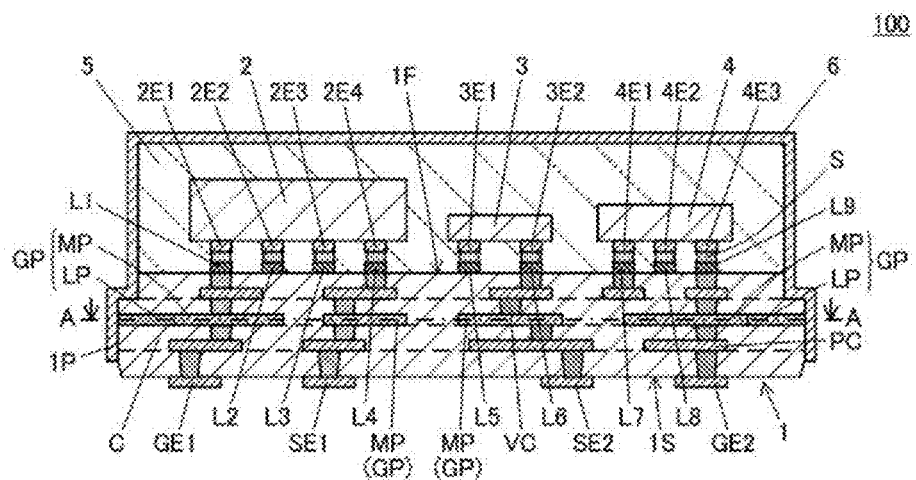
FIG. 4A is a schematic sectional view of an electronic circuit module as a first embodiment of an electronic circuit module according to embodiments of the present invention.

FIG. 4A is a schematic sectional view of the electronic circuit module 100. FIG. 4B is a magnified schematic diagram of a connection portion between the grounding pattern conductor GP of the ceramic circuit board 1 and the electrically conductive film 6 in a sectional view on arrow of the electronic circuit module 100 cut away along a plane containing a line A-A (indicated by alternate long and short dashed lines in the drawing) illustrated in FIG. 4A.

The electronic circuit module 100 includes a ceramic circuit board 1, electronic components 2 to 4, an embedding layer 5, and an electrically conductive film 6. The ceramic circuit board 1 is the ceramic circuit board according to embodiments of the present invention. Outer electrodes 2E1 to 2E4 of the electronic component 2 are connected to the corresponding connection lands L1 to L4 disposed on one principal surface 1F of the ceramic circuit board 1 by using solder S. Likewise, outer electrodes 3E1 and 3E2 of the electronic component 3 are connected to the corresponding connection lands L5 and L6. Likewise, outer electrodes 4E1 to 4E3 of the electronic component 4 are connected to the corresponding connection lands L7 to L9.

The embedding layer 5 is disposed on the one principal surface 1F of the ceramic circuit board 1 configured to embed the electronic components 2 to 4. The electrically conductive film 6 is disposed on the region containing outer surface, that is, the upper surface of the embedding layer 5, the side surface continued from the upper surface, and at least part of the side surface 1P of the ceramic circuit board 1.

Figure 4B:
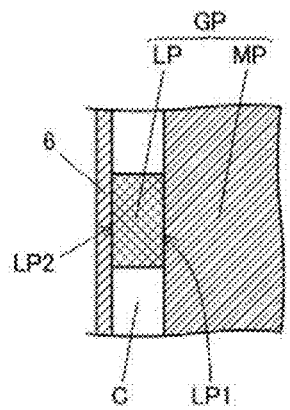
FIG. 4B is a magnified schematic diagram of a connection portion between a grounding pattern conductor and an electrically conductive film.

As illustrated in the magnified diagram of FIG. 4B, the electrically conductive film 6 is connected to the other end portion LP2 of the extended portion LP of the grounding pattern conductor GP. The one end portion LP1 of the extended portion LP is connected to the pattern main portion MP and, as illustrated in FIG. 4A, the pattern main portions MP are connected to the grounding electrodes GE1 and GE2 with pattern conductors PC and the via conductors VC interposed therebetween. Therefore, the electrically conductive film 6 is connected to the grounding electrodes GE1 and GE2 so as to serve as a shield against electromagnetic noise.

As described above, the ceramic circuit board 1 included in the electronic circuit module 100 is the ceramic circuit board according to embodiments of the present invention. Accordingly, the other end portion LP2 of the grounding pattern conductor GP is located at a position sufficiently close to the side surface 1P of the ceramic circuit board 1 and is reliably connected to the electrically conductive film 6 for shielding. As a result, an effect of shielding against electromagnetic noise is enhanced sufficiently.

Method for Manufacturing Electronic Circuit Module

An example of a method for manufacturing the electronic circuit module 100 illustrated in FIGS. 4A and 4B will be described with reference to FIGS. 5A to 7C.

First Step (Green Sheet Production Step)

Figure 5A:
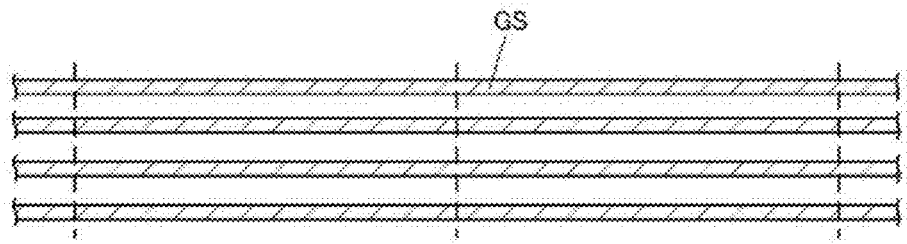
FIGS. 5A to 5E are schematic diagrams illustrating an example of a method for manufacturing the electronic circuit module illustrated in FIGS. 4A and 4B and indicating steps from the first step (green sheet production step) to the sixth step (firing step)

The first step is a step for producing green sheets GS containing a raw material powder for the ceramic insulator layer C included in the ceramic circuit board 1. FIG. 5A is a schematic diagram of green sheets GS prepared in the first step. Broken lines indicates a region of one electronic circuit module 100.

Second Step (Grounding Pattern Conductor Before Firing Formation Step)

The second step is a step for forming grounding pattern conductors GGP before firing in the collective state on at least one of the green sheets. In this step, pattern conductors GPC before firing are also formed. The grounding pattern conductors GGP before firing in the collective state include pattern main portions GMP before firing and extended portions GLP before firing in the collective state having one end portion connected to the pattern main portion GMP before firing. In the present example, two pattern main portions GMP before firing are arranged at both end portions of one extended portion GLP before firing in the collective state.

The grounding pattern conductor GGP before firing in the collective state contains a metal and an oxide of at least one metal element contained in the ceramic insulator layer C. The extended portion GLP before firing in the collective state is configured to have a metal content lower than the metal content of the pattern main portion GMP before firing.

Preferably, the formation of the pattern main portion GMP before firing in the second step is performed by using a first electrode paste configured to have a ratio of about 0/100 or more and 20/80 or less, where the denominator is the volume of a Cu powder and the numerator is the volume of the oxide powder of at least one metal element contained in the ceramic insulator layer C.

Preferably, the formation of the extended portion GLP before firing in the collective state is performed by using a second electrode paste composed of a copper powder coated with $Al_2O_3$ so as to have a ratio of about 4/96 or more and 6/94 or less, where the denominator is the weight of Cu and the numerator is the weight of $Al_2O_3$. Alternatively, it is preferable that the formation be performed by using a third electrode paste configured to have a ratio of about 10/90 or more and 20/80 or less, where the denominator is the volume of a Cu powder coated with $Al_2O_3$ such that a ratio of the weight of $Al_2O_3$ to the weight of Cu is about 1/99 or more and 3/97 or less and the numerator is the volume of the oxide powder of at least one metal element contained in the ceramic insulator layer.

Another method is also preferable, wherein the formation of the pattern main portion GMP before firing in the second step is performed by using the first electrode paste, and the formation of the extended portion GLP before firing in the collective state is performed by using a fourth electrode paste containing a CuAl alloy powder configured to have a ratio of about 2/98 or more and 5/95 or less, where the denominator is the weight of Cu and the numerator is the weight of Al.

Third Step (Via Conductor Before Firing Formation Step)

Figure 5B:
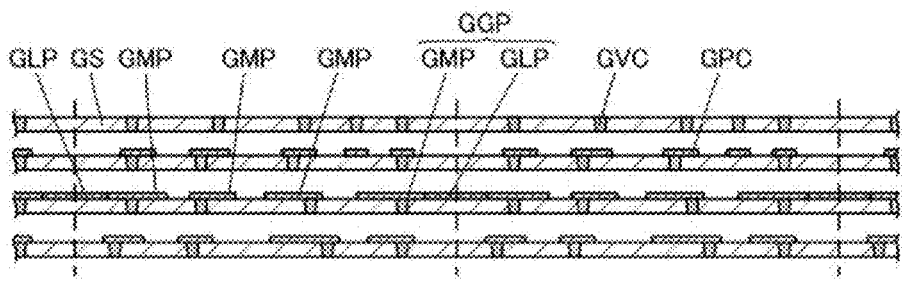

The third step is a step for forming via conductors GVC before firing in at least one of the green sheets GS, the via conductors GVC penetrating the green sheet GS. FIG. 5B is a schematic diagram of the green sheets GS provided with the grounding pattern conductors GGP before firing in the collective state, the pattern conductors GPC before firing, and the via conductors GVC before firing in the second and third steps.

Fourth Step (Multilayer Body Production Step)

Figure 5C:
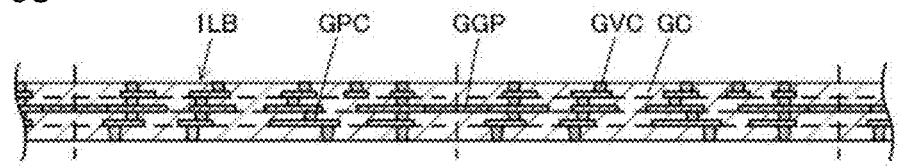

The fourth step is a step for producing a multilayer body 1LB by stacking the green sheets GS provided with the grounding pattern conductors GGP before firing in the collective state, the pattern conductors GPC before firing, and the via conductors GVC before firing. FIG. 5C is a schematic diagram of the multilayer body 1LB produced in the fourth step. In the fourth step, the multilayer body 1LB may be produced so as to include green sheets GS not provided with conductors. The multilayer body 1LB includes the ceramic insulator layers GC before firing, the grounding pattern conductors GGP before firing in the collective state, the pattern conductors GPC before firing, and the via conductors GVC before firing.

Fifth Step (Ceramic Circuit Board Before Firing Production Step)

Figure 5D:
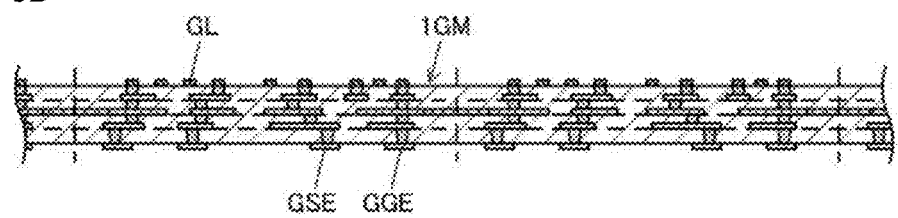

The fifth step is a step for producing a ceramic circuit board 1GM before firing in the collective state by forming connection lands before firing on one principal surface of the multilayer body 1LB and forming grounding electrodes GGE before firing and signal electrodes GSE before firing on the other principal surface of the multilayer body. FIG. 5D is a schematic diagram of the ceramic circuit board 1GM before firing in the collective state produced in the fifth step.

Sixth Step (Firing Step)

Figure 5E:
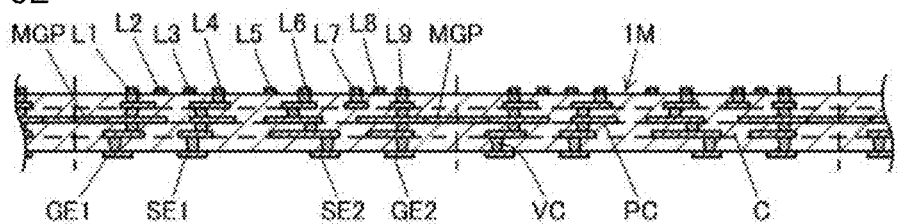

The sixth step is a step for producing a ceramic circuit board 1M in the collective state by firing the ceramic circuit board 1GM before firing in the collective state. FIG. 5E is a schematic diagram of the ceramic circuit board 1M in the collective state produced in the sixth step. The ceramic circuit board 1M in the collective state includes the ceramic insulator layer C, the grounding pattern conductors MGP in the collective state, the pattern conductors PC, the via conductors VC, the connection lands L1 to L9 disposed on the one principal surface, the grounding electrodes GE1 and GE2 disposed on the other principal surface and connected to the grounding pattern conductors MGP in the collective state, and the signal electrodes SE1 and SE2.

Seventh Step (Electronic Component Connection Step)

Figure 6A:
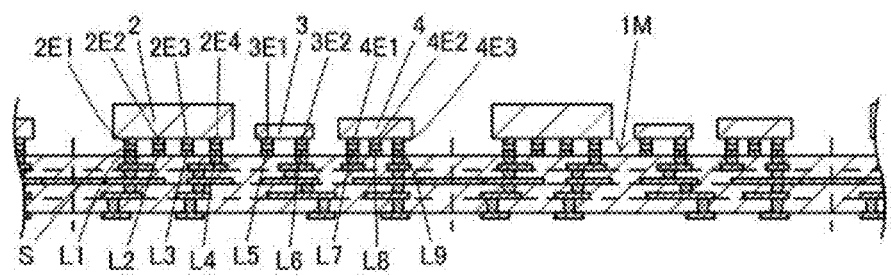
FIGS. 6A to 6C are schematic diagrams illustrating an example of the method for manufacturing the electronic circuit module illustrated in FIGS. 4A and 4B and indicating steps from the seventh step (electronic component connection step) following the step illustrated in FIG. 5E to the ninth step (slit formation step)

The seventh step is a step for connecting the electronic components 2 to 4 to the connection lands L1 to L9 disposed on the one principal surface of the ceramic circuit board 1M in the collective state. FIG. 6A is a schematic diagram of the ceramic circuit board 1M in the collective state connected to the electronic components 2 to 4 in the seventh step. The outer electrodes 2E1 to 2E4 of the electronic component 2 are connected to the corresponding connection lands L1 to L4 by using solder S. Likewise, the outer electrodes 3E1 and 3E2 of the electronic component 3 are connected to the corresponding connection lands L5 and L6. Likewise, the outer electrodes 4E1 to 4E3 of the electronic component 4 are connected to the corresponding connection lands L7 to L9.

Eighth Step (Embedding Layer Formation Step)

Figure 6B:
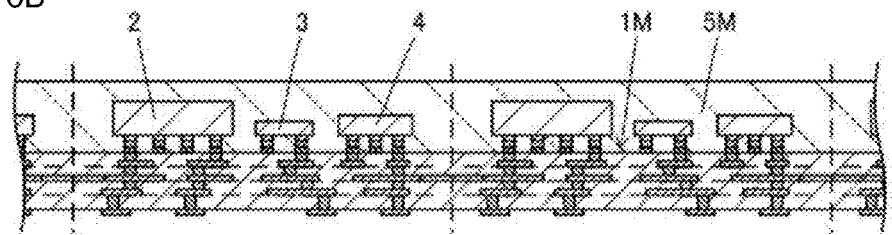

The eighth step is a step for forming an embedding layer 5M in the collective state on the one principal surface of the ceramic circuit board 1M in the collective state so as to embed the electronic components 2 to 4. FIG. 6B is a schematic diagram of the ceramic circuit board 1M in the collective state provided with the embedding layer 5M in the collective state on the one principal surface so as to embed the electronic components 2 to 4 in the eighth step.

Ninth Step (Slit Formation Step)

Figure 6C:
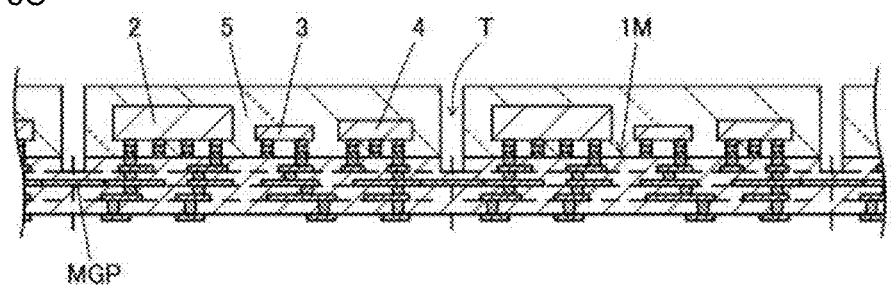

The ninth step is a step for cutting the embedding layer 5M in the collective state and forming slits T, which have a depth not exposing the grounding pattern conductors MGP in the collective state, into the one principal surface of the ceramic circuit board 1M in the collective state. FIG. 6C is a schematic diagram of the ceramic circuit board 1M in the collective state, wherein the embedding layer 5M in the collective state formed on the one principal surface is made into individual embedding layers 5 and slits T are formed in the ninth step. Cutting of the embedding layer 5M in the collective state and formation of the slits T can be performed by using, for example, a dicing saw.

Tenth Step (Cutting Step)

The tenth step is a step for producing a piece including the ceramic circuit board 1, the electronic components 2 to 4, and the embedding layer 5 by cutting the ceramic circuit board 1M, in the collective state, provided with the slits so as to expose the other end portion LP2 of the extended portion LP of the grounding pattern conductor GP.

Figure 7A:
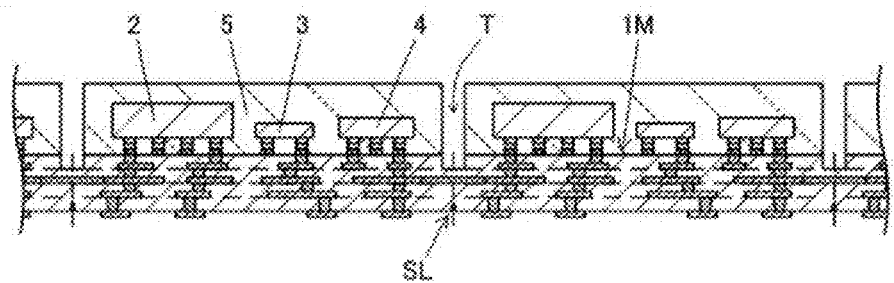
FIGS. 7A to 7C are schematic diagrams illustrating an example of the method for manufacturing the electronic circuit module illustrated in FIGS. 4A and 4B and indicating steps from the tenth step (cutting step) following the step illustrated in FIG. 6C to the eleventh step (electrically conductive film formation step)
Figure 7B:
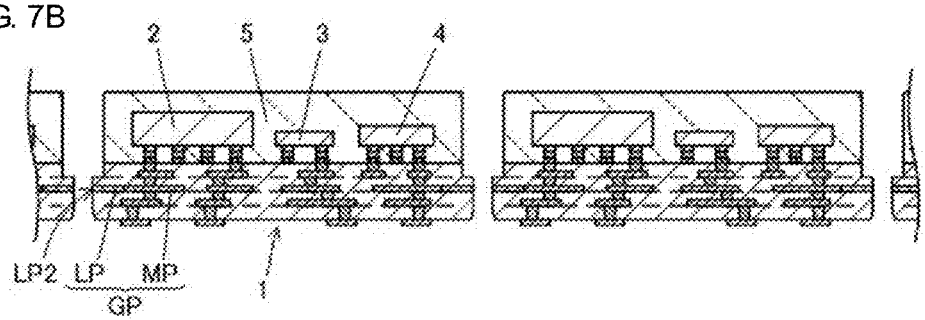

Examples of cutting methods include a method in which stress is applied to the locations provided with the scribe lines so as to merge the scribe lines with the slits and cut the ceramic circuit board 1M in the collective state. FIG. 7A is a schematic diagram illustrating the state of formation of scribe lines SL at positions, which are opposite to the slits formed in the one principal surface in the ninth step, of the other principal surface of the ceramic circuit board 1M in the collective state. FIG. 7B is a schematic diagram illustrating the state of cutting of the ceramic circuit board 1M in the collective state by applying stress to the locations provided with the scribe lines SL so as to merge the scribe lines SL with the slits.

Eleventh Step (Electrically Conductive Film Formation Step)

Figure 7C:
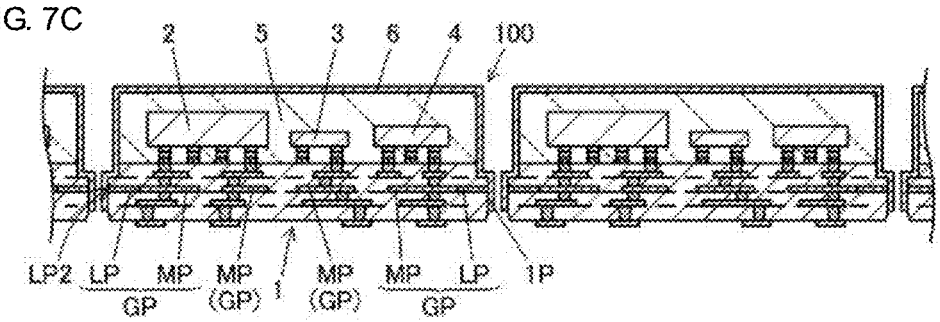

The eleventh step is a step for forming the electrically conductive film 6 on the region including the outer surface of the embedding layer 5 and at least part of the side surface 1P of the ceramic circuit board 1 of the piece so as to be connected to the other end portions LP2 of the extended portions LP of the grounding pattern conductors GP. FIG. 7C is a schematic diagram illustrating the state of the electronic circuit module 100 according to embodiments of the present invention produced by forming the electrically conductive film 6 on the above-described locations of the piece obtained in the step 10.

The electronic circuit module having a sufficiently high effect of shielding against electromagnetic noise can be reliably and easily obtained by the production method including the first to eleventh steps described above.

Second Embodiment of Electronic Circuit Module

An electronic circuit module 100A as a second embodiment of the electronic circuit module according to embodiments of the present invention will be described with reference to FIG. 8.

Structure of Electronic Circuit Module

Figure 8:
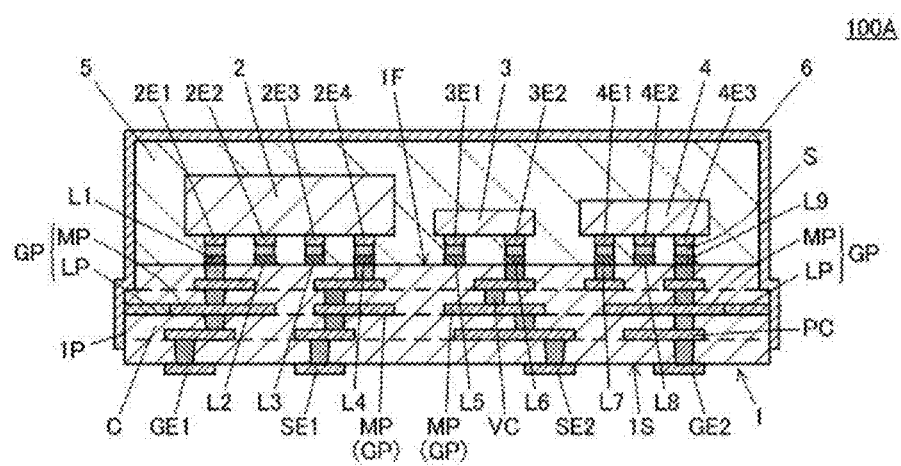
FIG. 8 is a schematic sectional view of an electronic circuit module as a second embodiment of the electronic circuit module according to embodiments of the present invention.

FIG. 8 is a schematic sectional view of the electronic circuit module 100A. The basic structure of the electronic circuit module 100A is the same as the structure of the electronic circuit module 100. Regarding the method for manufacturing the electronic circuit module 100, as described above, a method, in which the scribe lines are formed, is adopted in the tenth step (cutting step). On the other hand, the method for manufacturing the electronic circuit module 100A is different from the method for manufacturing the electronic circuit module 100 in the tenth step. The method for manufacturing the electronic circuit module 100A will be described below.

Method for Manufacturing Electronic Circuit Module

As described above, the method for manufacturing the electronic circuit module 100A is different from the method for manufacturing the electronic circuit module 100 only in the tenth step. Therefore, only the tenth step will be described and explanations of the first to nine steps and the eleventh step will not be provided.

Tenth Step (Cutting Step)

Figure 9A:
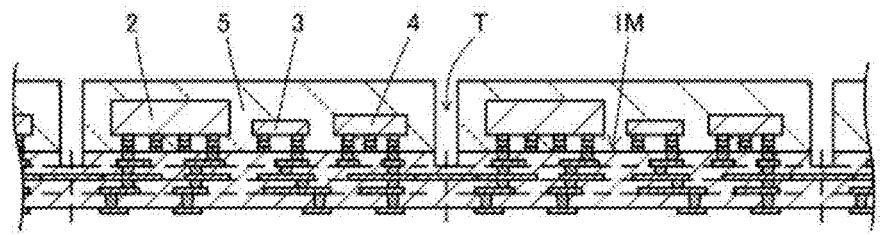
FIGS. 9A to 9C are schematic diagrams illustrating an example of the method for manufacturing the electronic circuit module illustrated in FIG. 8 and indicating steps from the ninth step (slit formation step) to the eleventh step (electrically conductive film formation step) in conformity with FIG. 5A to FIG. 7C.

In the method for manufacturing the electronic circuit module 100A, instead of a method, in which the scribe lines are formed, a method by forming other slits is adopted as the tenth step. FIG. 9A is a schematic diagram of the ceramic circuit board 1M in the collective state, wherein the embedding layer 5M in the collective state formed on the one principal surface is made into individual embedding layers 5 and slits T are formed in the ninth step, as in the method for manufacturing the electronic circuit module 100.

Figure 9B:
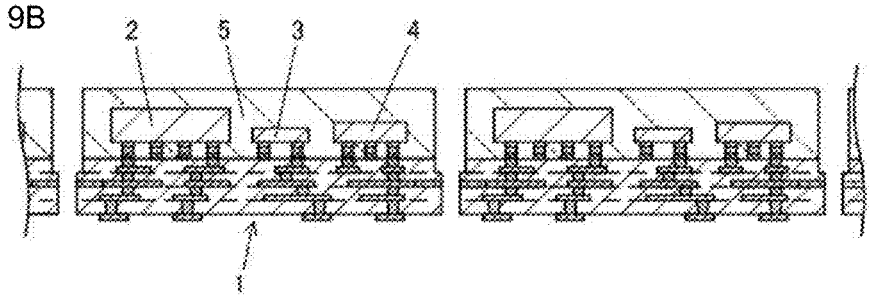

FIG. 9B is a schematic diagram illustrating the state in which slits having a width smaller than the width of the slits in the one principal surface of the ceramic circuit board 1M in the collective state are formed from the bottom portion of the slits T formed in the ceramic circuit board 1M in the collective state so as to reach the other principal surface in the tenth step. The slits having a width smaller than the width of the slits in the one principal surface of the ceramic circuit board 1M in the collective state can be formed by using a dicing saw with a blade having a width smaller than the width of the blade of the dicing saw used for forming the above-described slits. In this case, traces of the scribe lines do not remain in the other principal surface of the ceramic circuit board 1.

Figure 9C:
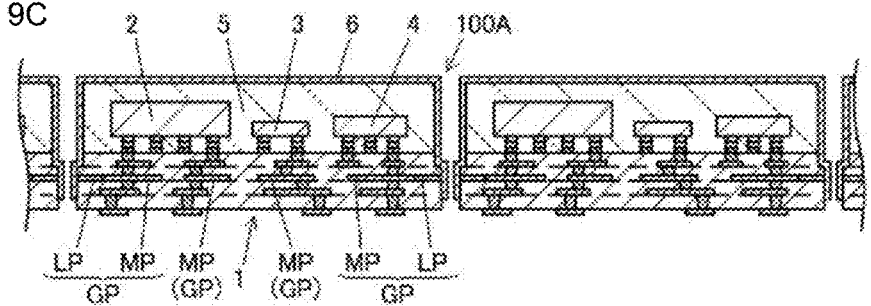

FIG. 9C is a schematic diagram illustrating the state of the electronic circuit module 100A according to embodiments of the present invention produced in the eleventh step by forming the electrically conductive film 6 on the piece obtained in the tenth step, as in the method for manufacturing the electronic circuit module 100.

The electronic circuit module having a sufficiently high effect of shielding against electromagnetic noise can also be reliably and easily obtained by the above-described manufacturing method.

EXPERIMENTAL EXAMPLES

Next, the present invention will be described specifically with reference to the experimental examples. These experimental examples provide grounds for specifying preferable conditions of the ceramic circuit board, the electronic circuit module, and the method for manufacturing the electronic circuit module according to embodiments of the present invention.

Figure 10A:
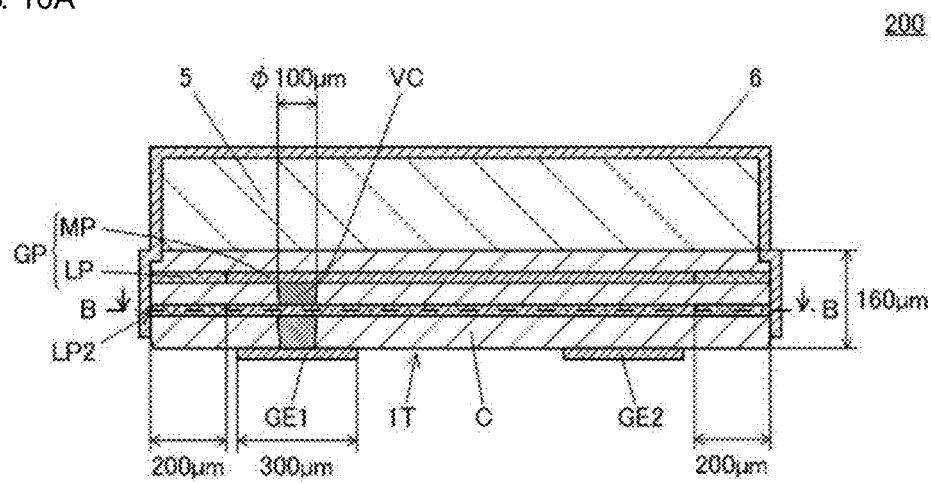
FIGS. 10A and 10B are schematic sectional views of an evaluation test electronic circuit module produced so as to have a simplified structure for the purpose of evaluating various characteristics of the electronic circuit module according to embodiments of the present invention.
Figure 10B:
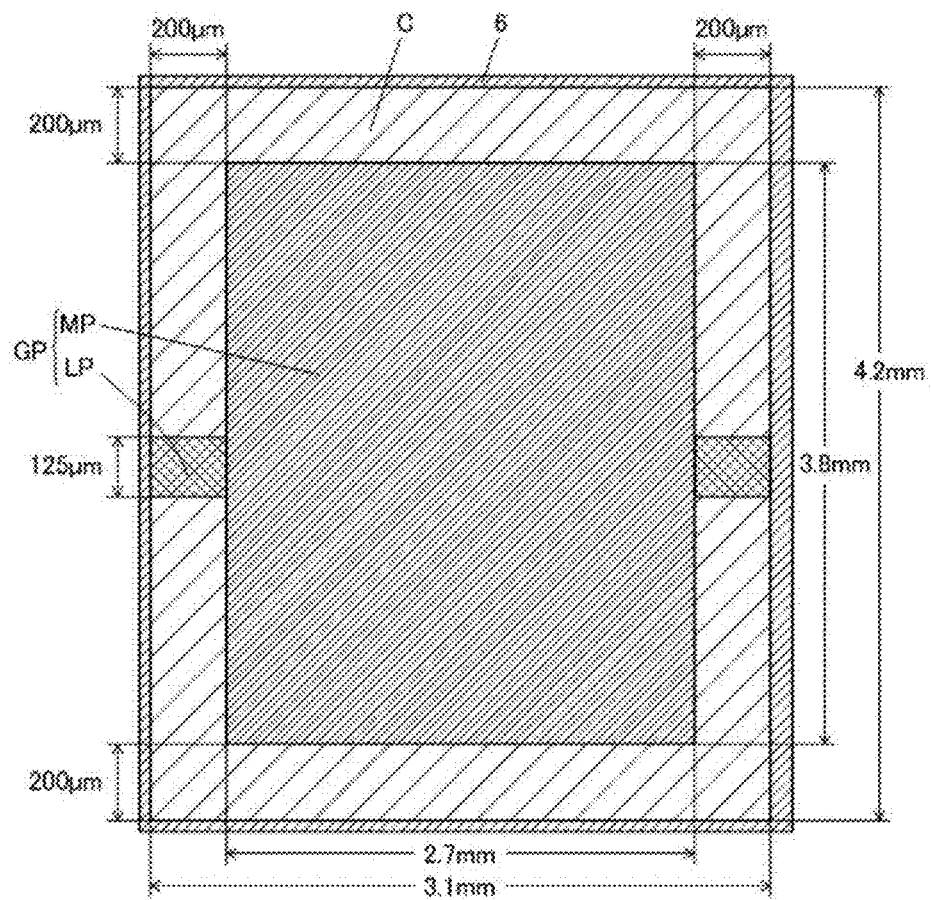

In the experimental examples described below, in order to evaluate various characteristics of the electronic circuit module according to embodiments of the present invention, as illustrated in FIGS. 10A and 10B, an evaluation test electronic circuit module 200 including a ceramic circuit board 1T, which was based on the ceramic circuit board 1 and which had a simplified structure, the embedding layer 5, and the electrically conductive film 6 was produced and various experiments were performed thereon. FIG. 10B is a sectional view on arrow of the evaluation test electronic circuit module 200 cut away along a plane containing a line B-B (indicated by alternate long and short dashed lines in the drawing) illustrated in FIG. 10A. The dimensions of each element of the ceramic circuit board 1T were as illustrated in FIGS. 10A and 10B.

For the purpose of easily evaluating the connectivity between the grounding pattern conductor GP (extended portion LP) and the electrically conductive film 6 described later, the evaluation test electronic circuit module 200 included two sheets of grounding pattern conductors GP, each of which is connected to the electrically conductive film 6. The manufacturing method, the experimental method, and the results thereof will be described below.

Production of Green Sheet

Starting raw material powders were weighed so as to have the composition ratio shown in Table 1. Wet mixing pulverization and drying were performed so as to obtain a mixture. The resulting mixture was heat-treated and, thereby, a raw material powder for green sheets of a ceramic insulator was produced. An organic binder, a dispersing agent, and a plasticizer were added and mixing pulverization was performed so as to produce a ceramic slurry. Subsequently, the ceramic slurry was formed into the shape of a sheet on a base material film by a doctor blade method, and drying was performed so as to produce a green sheet having a thickness adjusted to a predetermined thickness after firing.

TABLE 1

| | Insulator raw material powder | | | | | |
|---|---|---|---|---|---|---|
| | $SiO_2$ | $Al_2O_3$ | $BaCO_3$ | $ZrO_2$ | $TiO_2$ | $Mg(OH)_2$ | $MnCO_3$ |
| Weight ratio/100 | 55.0 | 12.0 | 26.0 | 0.5 | 2.0 | 0.5 | 4.0 |

Production of Conductor Paste

The starting raw materials were mixed so as to have a predetermined composition ratio, and a dispersion treatment was performed by a three-roll mill. A Cu powder, an oxide powder, an organic vehicle shown in Table 2 to Table 4 were used as the raw materials. As a result, conductor pastes having various volume ratios of the metal to the oxide were obtained. The conductor pastes obtained as described above are shown in Table 5 to Table 7. The conductor pastes are roughly divided into conductor pastes having high metal contents (HP1 to HP10) and conductor pastes having low metal contents (LP-C-1 to LP-C-25 and LP-A-1 to LP-A-4).

TABLE 2

| | Metal powder type No. | Type | $D_{50}$ (μm) | Amount of alumina (wt %) | Amount of Al (wt %) |
|---|---|---|---|---|---|
| | M-1 | Cu | 3 | — | — |
| | M-2 | alumina-coated Cu | 3 | 1 | — |
| | M-3 | alumina-coated Cu | 3 | 2 | — |
| | M-4 | alumina-coated Cu | 3 | 3 | — |
| | M-5 | alumina-coated Cu | 3 | 4 | — |
| | M-6 | alumina-coated Cu | 3 | 5 | — |
| | M-7 | alumina-coated Cu | 3 | 6 | — |
| * | M-8 | alumina-coated Cu | 3 | 7 | — |
| | M-9 | CuAl alloy | 3 | — | 2 |
| | M-10 | CuAl alloy | 3 | — | 3 |
| | M-11 | CuAl alloy | 3 | — | 5 |
| * | M-12 | CuAl alloy | 3 | — | 7 |

*: Out of the scope of the present invention.

TABLE 3

| Oxide powder type No. | Type | $D_{50}$ (μm) | SSA ($m^2/g$) |
|---|---|---|---|
| OX-1 | $Al_2O_3$ | 0.5 | 10 |
| OX-2 | Ba—Si—Al—Mn oxide | 1.3 | 8 |

TABLE 4

| Organic vehicle composition No. | Composition (vol %) | |
|---|---|---|
| | Ethyl cellulose | Dihydroterpinyl acetate |
| OV-1 | 10 | 90 |

TABLE 5

| | | Composition (vol %) | | | | |
|---|---|---|---|---|---|---|
| | Conductor paste composition No. | Metal powder | Oxide powder | | Organic vehicle | Oxide/metal (volume ratio) |
| | | M-1 | OX-1 | OX-2 | OV-1 | |
| | HP-1 | 20.0 | — | — | 80.0 | 0/100 |
| | HP-2 | 18.0 | 2.0 | — | 80.0 | 10/90 |
| | HP-3 | 16.0 | 4.0 | — | 80.0 | 20/80 |
| * | HP-4 | 14.0 | 6.0 | — | 80.0 | 30/70 |
| | HP-5 | 18.0 | — | 2.0 | 80.0 | 10/90 |
| | HP-6 | 16.0 | — | 4.0 | 80.0 | 20/80 |
| * | HP-7 | 14.0 | — | 6.0 | 80.0 | 30/70 |
| | HP-8 | 18.0 | 1.0 | 1.0 | 80.0 | 10/90 |
| | HP-9 | 16.0 | 2.0 | 2.0 | 80.0 | 20/80 |
| * | HP-10 | 14.0 | 3.0 | 3.0 | 80.0 | 30/70 |

*: Out of the scope of the present invention.

TABLE 6

| Conductor paste composition No. | Composition (vol %) | | | | | | | | | | |
|---|---|---|---|---|---|---|---|---|---|---|---|
| | Metal powder | | | | | | | Oxide powder | | Organic vehicle | Oxide/metal (volume ratio) |
| | M-2 | M-3 | M-4 | M-5 | M-6 | M-7 | M-8 | OX-1 | OX-2 | OV-1 | |
| * LP-C-1 | 20.0 | — | — | — | — | — | — | — | — | 80.0 | 0/100 |
| * LP-C-2 | — | 20.0 | — | — | — | — | — | — | — | 80.0 | 0/100 |
| * LP-C-3 | — | — | 20.0 | — | — | — | — | — | — | 80.0 | 0/100 |
| LP-C-4 | — | — | — | 20.0 | — | — | — | — | — | 80.0 | 0/100 |
| LP-C-5 | — | — | — | — | 20.0 | — | — | — | — | 80.0 | 0/100 |
| LP-C-6 | — | — | — | — | — | 20.0 | — | — | — | 80.0 | 0/100 |
| * LP-C-7 | — | — | — | — | — | — | 20.0 | — | — | 80.0 | 0/100 |
| LP-C-8 | 18.0 | — | — | — | — | — | — | 2.0 | — | 80.0 | 10/90 |
| LP-C-9 | — | 18.0 | — | — | — | — | — | 2.0 | — | 80.0 | 10/90 |
| LP-C-10 | — | — | 18.0 | — | — | — | — | 2.0 | — | 80.0 | 10/90 |
| LP-C-11 | 16.0 | — | — | — | — | — | — | 4.0 | — | 80.0 | 20/80 |
| LP-C-12 | — | 16.0 | — | — | — | — | — | 4.0 | — | 80.0 | 20/80 |
| LP-C-13 | — | — | 16.0 | — | — | — | — | 4.0 | — | 80.0 | 20/80 |
| LP-C-14 | 18.0 | — | — | — | — | — | — | — | 2.0 | 80.0 | 10/90 |
| LP-C-15 | — | 18.0 | — | — | — | — | — | — | 2.0 | 80.0 | 10/90 |
| LP-C-16 | — | — | 18.0 | — | — | — | — | — | 2.0 | 80.0 | 10/90 |
| LP-C-17 | 16.0 | — | — | — | — | — | — | — | 4.0 | 80.0 | 20/80 |
| LP-C-18 | — | 16.0 | — | — | — | — | — | — | 4.0 | 80.0 | 20/80 |
| LP-C-19 | — | — | 16.0 | — | — | — | — | — | 4.0 | 80.0 | 20/80 |
| LP-C-20 | 18.0 | — | — | — | — | — | — | 1.0 | 1.0 | 80.0 | 10/90 |
| LP-C-21 | — | 18.0 | — | — | — | — | — | 1.0 | 1.0 | 80.0 | 10/90 |
| LP-C-22 | — | — | 18.0 | — | — | — | — | 1.0 | 1.0 | 80.0 | 10/90 |
| LP-C-23 | 16.0 | — | — | — | — | — | — | 2.0 | 2.0 | 80.0 | 20/80 |
| LP-C-24 | — | 16.0 | — | — | — | — | — | 2.0 | 2.0 | 80.0 | 20/80 |
| LP-C-25 | — | — | 16.0 | — | — | — | — | 2.0 | 2.0 | 80.0 | 20/80 |

*: Out of the scope of the present invention.

TABLE 7

| Conductor paste composition No. | Composition (vol %) | | | | |
|---|---|---|---|---|---|
| | Metal powder | | | | Organic vehicle |
| | M-9 | M-10 | M-11 | M-12 | OV-1 |
| LP-A-1 | 20.0 | — | — | — | 80.0 |
| LP-A-2 | — | 20.0 | — | — | 80.0 |
| LP-A-3 | — | — | 20.0 | — | 80.0 |
| * LP-A-4 | — | — | — | 20.0 | 80.0 |

*: Out of the scope of the present invention.

Printing of Green Sheet with Conductor Paste

The green sheets were printed with the conductor paste produced as described above. Printing was performed by screen printing. At that time, in some green sheets, the entire surfaces of the grounding pattern conductors GP were printed with the respective conductor pastes produced as described above, and in some green sheets, locations serving as the pattern main portions MP and the locations serving as the extended portions LP were printed with the conductor pastes in the respective combinations shown in Table 8.

TABLE 8

| | Board sample No. | Conductor paste composition No. | |
|---|---|---|---|
| | | Pattern main portion | Extended portion |
| | C-1 | HP-9 | LP-C-20 |
| | C-2 | HP-9 | LP-A-2 |
| * | C-3 | HP-9 | HP-9 |
| * | C-4 | LP-C-20 | HP-9 |
| * | C-5 | LP-A-2 | HP-9 |
| * | C-6 | LP-C-20 | LP-C-20 |
| * | C-7 | LP-A-2 | LP-A-2 |

*: Out of the scope of the present invention.

Formation of Via Conductor in Green Sheet

Predetermined locations of the green sheets were irradiated with a laser in the thickness direction of the green sheets so as to form via holes penetrating the green sheets. The resulting via holes were filled with the conductor paste containing Cu as an electrical conductor, and drying was performed by using a hot-air drier at 80° C. for 5 minutes so as to produce green sheets provided with via conductors before firing.

Stacking and Pressure Bonding of Green Sheet

A multilayer body was produced by stacking predetermined numbers of the green sheets printed with the conductor paste serving as the grounding pattern conductor GP and the green sheets provided with the via conductors before firing and performing pressure bonding under the conditions in which the temperature was within the range of 60° C. or higher and 80° C. or lower and the pressure was within the range of 1,000 kg/cm² or more and 1,500 kg/cm² or less.

Formation of Grounding Electrode Before Firing

A ceramic circuit board before firing was produced by forming grounding electrodes before firing on the lower surface of the multilayer body by the conductor paste containing Cu as an electrical conductor.

Firing of Ceramic Circuit Board Before Firing

A ceramic circuit board in the collective state was produced by firing the ceramic circuit board before firing under the firing condition including a degreasing step for removing an organic binder.

Formation of Embedding Layer

In the evaluation test electronic circuit module 200, the electronic component was not connected for the purpose of simplifying the structure. Therefore, only the embedding layer in the collective state was formed on one principal surface of the ceramic circuit board in the collective state. In the embedding layer, for example, a glass material or silica serving as a filler was dispersed in an insulating resin material. In this regard, the embedding layer may be a single insulating resin material including no filler.

Cutting of Embedding Layer and Formation of Slit in Ceramic Circuit Board

The embedding layer in the collective state, formed as described above, was cut and slits, which had a depth not exposing the grounding pattern conductor in the collective state, were formed into the one principal surface of the ceramic circuit board in the collective state.

Cutting of Ceramic Circuit Board in Collective State

Scribe lines were made in the other surface of the ceramic circuit board in the collective state by a diamond knife or the like. Thereafter, stress was applied to the locations provided with the scribe lines so as to merge the scribe lines with the above-described slits and individualize the ceramic circuit board in the collective state by breakage. Accordingly, the other end portions LP2 of the extended portions LP of the grounding pattern conductor GP were exposed.

Formation of Electrically Conductive Film

The electrically conductive film 6 was formed on the region including the outer surface of the embedding layer 5 and at least part of the side surface of the ceramic circuit board 1T so as to be connected to the other end portions LP2 of the extended portions LP of the grounding pattern conductors GP. Preferably, the electrically conductive film 6 is formed by at least one method selected from sputtering, plating, vapor deposition, and CVD. An electrically conductive resin film, in which a metal filler is dispersed in a resin base material, may be used as the electrically conductive film 6. Accordingly, the grounding electrode GE1 and the electrically conductive film 6 were connected with the grounding pattern conductor GP and the via conductor VC interposed therebetween.

Regarding each of the evaluation test electronic circuit module 200 produced as described above, the grounding pattern conductor thickness (hereafter referred to as electrode thickness t), the absolute value of the distance from the side surface of the ceramic circuit board to the other end portion of the extended portion (hereafter referred to as amount of electrode unevenness a), the metal content of each portion of the grounding pattern conductor (hereafter referred to as metal portion coverage), and the bondability between the grounding pattern conductor GP (extended portion LP) and the electrically conductive film 6 (hereafter referred to as connection resistance value) were evaluated.

Figure 11:
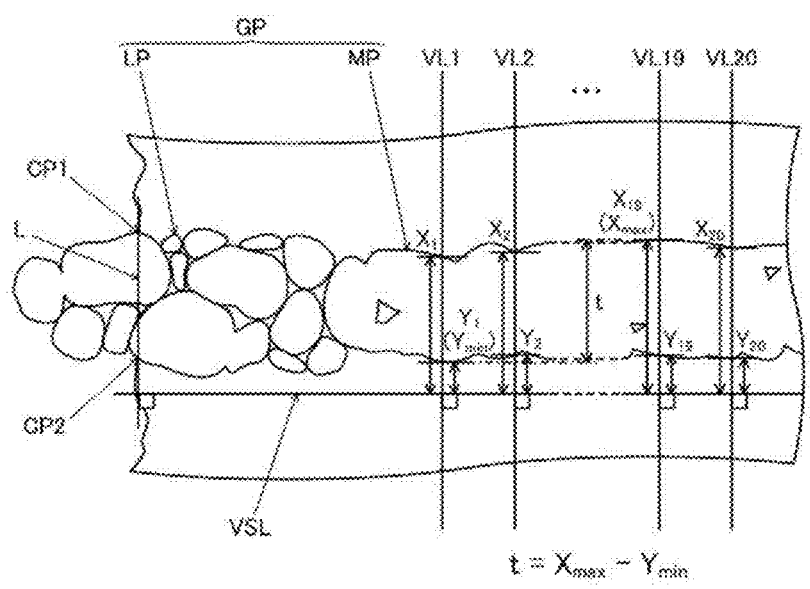
FIG. 11 is a schematic diagram indicating a method for measuring the distance from the side surface of the ceramic circuit board to the extended portion of the grounding pattern conductor (amount of electrode unevenness) in the evaluation test electronic circuit module illustrated in FIGS. 10A and 10B.

The electrode thickness t was measured by a method illustrated in FIG. 11. A cross-section of the evaluation test electronic circuit module 200 was polished, element mapping was performed by a wavelength-dispersive X-ray spectroscopic analyzer (WDX), and a region, in which the concentrations of the elements contained in the grounding pattern conductor GP were high, was binarized. Accordingly, the metal portion was clearly shown. Thereafter, the clearly shown metal portion was measured.

Interfaces CP1 and CP2 between the extended portion LP of the grounding pattern conductor GP and the ceramic insulator layer C exposed at the side surface of the ceramic circuit board 1T were determined, and a straight line L bonding the two was drawn. A straight line VSL orthogonal to the straight line L was drawn from the side surface of the ceramic circuit board 1T after cross-section polishing toward inside the ceramic circuit board 1T. Twenty straight lines VL1 to VL20 orthogonal to the straight line VSL were drawn from the straight line VSL at intervals of 10 µm, and each of the distances X1 to X20 between the straight line VSL and the intersect with the upper surface of the pattern main portion MP and the distances Y1 to Y20 between the straight line VSL and the lower surface of the pattern main portion MP was determined.

The difference between the maximum value Xmax among the distances X1 to X20 and the minimum value Ymin among the distances Y1 to Y20 was denoted as the electrode thickness t. The region surrounded by a straight line, which passed through the maximum value Xmax and which was parallel to the straight line VSL, a straight line, which passed through the minimum value Ymin and which was parallel to the straight line VSL, the straight line VL1, and the straight line VL20 was defined as the pattern main portion MP.

The method for measuring the pattern main portion MP was as described above. The extended portion LP was measured by the same measuring method. Also, the grounding pattern conductor GP, the entirety of which was composed of a single conductor paste, was measured by the same measuring method.

The metal portion coverage was measured by the following method. The ratio (percentage) of the area, in which the metal was detected, to the areas of the pattern main portion MP and the extended portion LP defined in measurement of the electrode thickness t was denoted as the metal portion coverage. Also, the grounding pattern conductor GP, the entirety of which was composed of a single conductor paste, was measured by the same measuring method.

Figure 12:
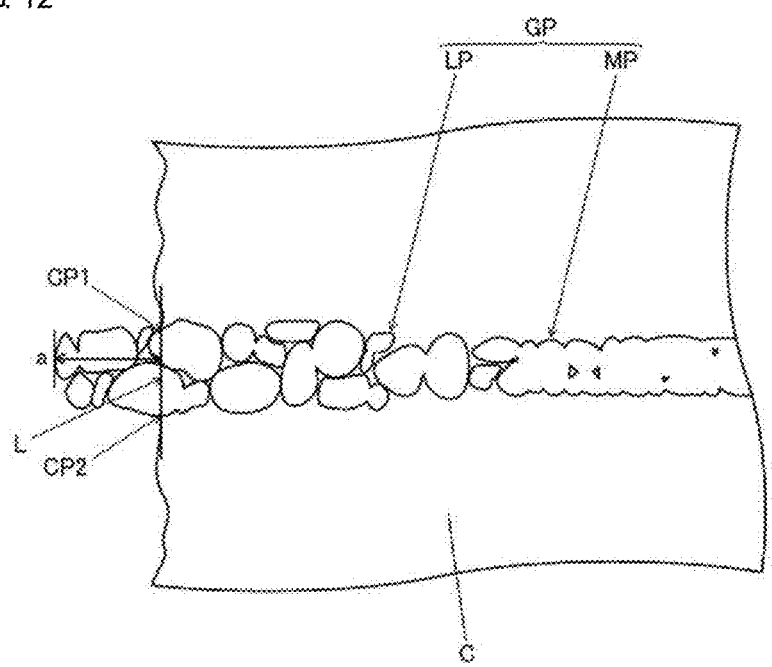
FIG. 12 is a schematic diagram indicating a method for measuring the electrode thickness of the pattern main portion of the grounding pattern conductor in the evaluation test electronic circuit module illustrated in FIGS. 10A and 10B.

The amount of electrode unevenness a was measured by the method illustrated in FIG. 12. Similarly to the measurement of the electrode thickness t, interfaces CP1 and CP2 between the extended portion LP of the grounding pattern conductor GP and the ceramic insulator layer C exposed at the side surface of the ceramic circuit board 1T were determined, and a straight line L bonding the two was drawn. The distance between the straight line L and the front end of the extended portion LP was denoted as the amount of electrode unevenness a. That is, even in the case where the extended portion LP is protruded from the side surface of the ceramic circuit board 1T, as illustrated in FIG. 12, or even in the case where the extended portion LP is inside the side surface of the ceramic circuit board 1T, the amount of electrode unevenness a is indicated by the absolute value of the distance. The amount of electrode unevenness a was measured at 20 locations and an average value thereof was determined.

Figure 13:
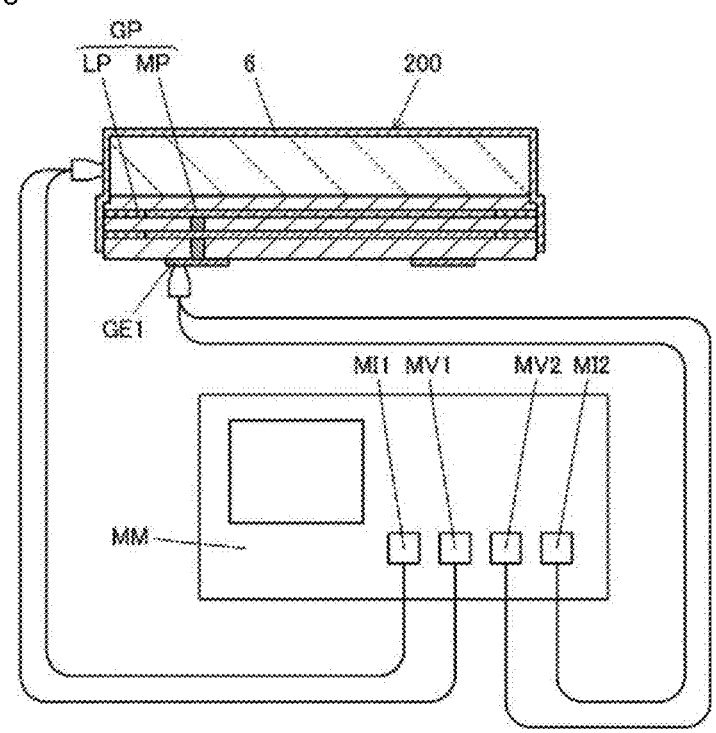
FIG. 13 is a schematic diagram indicating a method for evaluating the connectivity between the grounding pattern conductor and the electrically conductive film in the evaluation test electronic circuit module illustrated in FIGS. 10A and 10B.

The connection resistance value was measured by a direct current four-terminal method illustrated in FIG. 13. That is, probes connected to direct current terminals MI1 and MI2 of a resistance measuring instrument MM and probes connected to direct current voltage terminals MV1 and MV2 were brought into contact with the grounding electrode GE1 and the electrically conductive film 6 of the evaluation test electronic circuit module 200 so as to form a measurement circuit of the direct current four-terminal method, and the resistance between the grounding pattern conductor GP (extended portion LP) and the electrically conductive film 6 was measured.

The measurement results obtained as described above are shown in Table 9 to Table 12. In the case where the connection resistance value was 0.1Ω or less, the bondability was judged as good and is indicated by the symbol ◯, and in the case where the amount of electrode unevenness a was 10 μm or less, the cleavability was judged as good and is indicated by the symbol ○.

Table 9 shows the evaluation results of the evaluation test electronic circuit module 200 produced by using conductor pastes (HP1 to HP10) having high metal contents. In the case where the metal portion coverage was 80% or more, the connection resistance was 0.10Ω or less. In the case where the volume ratio of the oxide to the metal was 0/100 or more and 20/80 or less, the connection resistance was 0.1Ω or less, although the amount of electrode unevenness a was 10 μm or more. In the case where the volume ratio of the oxide to the metal was 30/70, the resistance was 0.1Ω or more.

TABLE 9

|   | Conductor paste composition No. | Electrode thickness t (μm) | Metal portion coverage (%) | Amount of electrode unevenness a (μm) | Connection resistance value (Ω) |
|---|---|---|---|---|---|
|   | HP-1 | 5 | 98 | 18 | 0.06 |
|   | HP-2 | 5 | 96 | 16 | 0.06 |
|   | HP-3 | 5 | 90 | 14 | 0.06 |
| * | HP-4 | 7 | 75 | 12 | 0.12 |
|   | HP-5 | 5 | 92 | 16 | 0.06 |
|   | HP-6 | 6 | 88 | 14 | 0.06 |
| * | HP-7 | 7 | 70 | 12 | 0.12 |
|   | HP-8 | 5 | 93 | 17 | 0.06 |
|   | HP-9 | 5 | 92 | 15 | 0.06 |
| * | HP-10 | 7 | 73 | 13 | 0.12 |

*: Out of the scope of the present invention.

Table 10 shows the evaluation results of the evaluation test electronic circuit module 200 produced by using conductor pastes (LP-C-1 to LP-C-25) having low metal contents. The metal portion coverage was reduced by alumina coating and addition of an oxide. In the case where the metal portion coverage was 30% or more and 60% or less, the amount of electrode unevenness a was 10 μm or less. The connection resistance was 0.1Ω or less in every case. On the other hand, in the case where the metal portion coverage was 20% or less, the connection resistance increased.

TABLE 10

|   | Conductor paste composition No. | Electrode thickness t (μm) | Metal portion coverage (%) | Amount of electrode unevenness a (μm) | Connection resistance value (Ω) |
|---|---|---|---|---|---|
| * | LP-C-1 | 5 | 98 | 16 | 0.06 |
| * | LP-C-2 | 5 | 97 | 16 | 0.06 |
| * | LP-C-3 | 5 | 96 | 16 | 0.06 |
|   | LP-C-4 | 8 | 60 | 3 | 0.12 |
|   | LP-C-5 | 9 | 45 | 2 | 0.15 |
|   | LP-C-6 | 10 | 30 | 1 | 0.20 |
| * | LP-C-7 | 11 | 20 | 1 | 0.50 |
|   | LP-C-8 | 9 | 50 | 3 | 0.12 |
|   | LP-C-9 | 9 | 48 | 3 | 0.12 |
|   | LP-C-10 | 9 | 46 | 3 | 0.12 |
|   | LP-C-11 | 9 | 40 | 2 | 0.12 |
|   | LP-C-12 | 10 | 38 | 2 | 0.12 |
|   | LP-C-13 | 10 | 36 | 2 | 0.12 |
|   | LP-C-14 | 9 | 50 | 3 | 0.12 |
|   | LP-C-15 | 9 | 48 | 3 | 0.12 |
|   | LP-C-16 | 9 | 46 | 3 | 0.12 |
|   | LP-C-17 | 10 | 40 | 2 | 0.12 |
|   | LP-C-18 | 10 | 38 | 2 | 0.12 |
|   | LP-C-19 | 10 | 36 | 2 | 0.12 |

TABLE 10-continued

| Conductor paste composition No. | Electrode thickness t (μm) | Metal portion coverage (%) | Amount of electrode unevenness a (μm) | Connection resistance value (Ω) |
|---|---|---|---|---|
| LP-C-20 | 9 | 50 | 3 | 0.12 |
| LP-C-21 | 9 | 48 | 3 | 0.12 |
| LP-C-22 | 9 | 46 | 3 | 0.12 |
| LP-C-23 | 10 | 40 | 2 | 0.12 |
| LP-C-24 | 10 | 38 | 2 | 0.12 |
| LP-C-25 | 10 | 36 | 2 | 0.12 |

*: Out of the scope of the present invention.

Table 11 shows the evaluation results of the evaluation test electronic circuit module 200 produced by using other conductor pastes (LP-A-1 to LP-A-4) having low metal contents. As the amount of Al in the CuAl alloy increased, the metal portion coverage was reduced, and the amount of electrode unevenness a was 10 μm or less in every case. The connection resistance was 0.1Ω or more in every case, and in the case where the amount of Al was 7 percent by weight or more, in particular, the connection resistance increased.

TABLE 11

|   | Conductor paste composition No. | Electrode thickness t (μm) | Metal portion coverage (%) | Amount of electrode unevenness a (μm) | Connection resistance value (Ω) |
|---|---|---|---|---|---|
|   | LP-A-1 | 8 | 40 | 1 | 0.12 |
|   | LP-A-2 | 10 | 35 | 1 | 0.14 |
|   | LP-A-3 | 10 | 30 | 1 | 0.20 |
| * | LP-A-4 | 11 | 25 | 1 | 0.50 |

*: Out of the scope of the present invention.

Table 12 shows the evaluation results of the evaluation test electronic circuit module 200 produced by combining the conductor pastes having high metal contents and the conductor pastes having low metal contents. In the case where the extended portion LP was formed by using a conductor paste, which had a reduced metal coverage (the metal portion coverage of 30% or more and 60% or less), and the pattern main portion MP was formed by using a conductor paste, which had an increased metal coverage (the metal portion coverage of 80% or more), the connection resistance was 0.1Ω or less, the amount of electrode unevenness a was 10 μm or less and, therefore, both the conditions of the connection resistance and the amount of electrode unevenness a were satisfied. The other combinations were not able to satisfy both the conditions of the connection resistance and the amount of electrode unevenness a.

TABLE 12

| | Board sample No. | Conductor paste composition No. | | Amount of electrode unevenness a (μm) | Connection resistance value (Ω) | Judgement | | |
|---|---|---|---|---|---|---|---|---|
| | | Pattern main portion | Extended portion | | | Connectivity | Cleavability | Overall judgement |
| | C-1 | HP-9 | LP-C-20 | 3 | 0.08 | ○ | ○ | ○ |
| | C-2 | HP-9 | LP-A-2 | 1 | 0.08 | ○ | ○ | ○ |
| * | C-3 | HP-9 | HP-9 | 12 | 0.08 | ○ | X | X |
| * | C-4 | LP-C-20 | HP-9 | 12 | 0.12 | X | X | X |
| * | C-5 | LP-A-2 | HP-9 | 12 | 0.12 | X | X | X |
| * | C-6 | LP-C-20 | LP-C-20 | 3 | 0.14 | X | ○ | X |
| * | C-7 | LP-A-2 | LP-A-2 | 1 | 0.16 | X | ○ | X |

*: Out of the scope of the present invention.

The present invention is not limited to the above-described embodiments and various applications and modifications can be made within the scope of the present invention. The operations described in the present specification are on the basis of the estimation and it is pointed out that the present invention is not limited to these operations. It is also pointed out that the embodiments described in the present specification are exemplifications and some configurations of one embodiment may be replaced with configurations of other embodiments, or configurations of different embodiments may be combined.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A ceramic circuit board comprising: a ceramic insulator layer; at least one grounding pattern conductor, the at least one grounding pattern conductor containing a metal and an oxide of at least one metal element contained in the ceramic insulator layer, the at least one grounding pattern conductor including a pattern main portion disposed within the ceramic circuit board and an extended portion having a first end thereof connected to the pattern main portion and a second end thereof exposed at a side surface of the ceramic circuit board, and a first metal content of the extended portion is lower than a second metal content of the pattern main portion; a connection land disposed on a first surface of the ceramic board; and a grounding electrode disposed on a second surface of the ceramic board and connected to the grounding pattern conductor, wherein the first metal content of the extended portion is 30 to 60 percent by volume, and the second metal content of the pattern main portion is 80 percent by volume or more.

2. The ceramic circuit board according to claim 1, wherein the first metal content of the extended portion is 30 to 60 percent by volume, and the second metal content of the pattern main portion is 80 percent by volume or more.

3. The ceramic circuit board according to claim 1, wherein the pattern main portion and the extended portion are disposed in a same plane.

4. The ceramic circuit board according to claim 1, wherein the pattern main portion and the extended portion are disposed in different planes, and are connected to each other by a via conductor.

5. The ceramic circuit board according to claim 1, wherein an absolute value of a distance from the side surface of the ceramic circuit board to the second end of the extended portion is 10 μm or less.

6. An electronic circuit module comprising:
the ceramic circuit board according to claim 1;
an electronic component;
an embedding layer; and
an electrically conductive film,
wherein the electronic component is connected to the connection land disposed on the first surface of the ceramic circuit board,
the embedding layer is disposed on the first surface of the ceramic circuit board so as to embed the electronic component, and
the electrically conductive film is disposed on a surface of the embedding layer and at least part of the side surface of the ceramic circuit board and is connected to the second end of the extended portion.

* * * * *